United States Patent
Yamada et al.

(10) Patent No.: US 6,534,845 B1
(45) Date of Patent: Mar. 18, 2003

(54) SEMICONDUCTOR DEVICE

(75) Inventors: Etsuo Yamada, Tokyo (JP); Kenji Nagasaki, Tokyo (JP); Yasushi Shiraishi, Tokyo (JP); Kazuhiko Sera, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/328,905

(22) Filed: Jun. 9, 1999

(30) Foreign Application Priority Data

Oct. 16, 1998 (JP) .................................... H10-295817

(51) Int. Cl.[7] .................... H01L 23/495; H01L 23/48; H01L 23/52
(52) U.S. Cl. .................... 257/669; 257/666; 257/735; 257/792; 257/787; 257/618; 257/620; 257/622
(58) Field of Search ............................. 257/669, 735, 257/792, 687, 618, 787

(56) References Cited

U.S. PATENT DOCUMENTS

| | | | | |
|---|---|---|---|---|
| 5,227,661 A | * | 7/1993 | Heinen | 257/669 |
| 5,287,003 A | * | 2/1994 | Van Andel et al. | 257/792 |
| 5,313,102 A | * | 5/1994 | Lim et al. | 257/787 |
| 5,668,400 A | * | 9/1997 | Quinn | 257/618 |
| 5,968,849 A | * | 10/1999 | Bello et al. | 438/747 |
| 5,986,335 A | * | 11/1999 | Amagai | 257/668 |
| 6,072,231 A | * | 6/2000 | Murakami et al. | 257/666 |

FOREIGN PATENT DOCUMENTS

| | | |
|---|---|---|
| JP | H4-44347 | 2/1992 |
| JP | H6-350010 | 12/1994 |
| JP | H7-249708 | 9/1995 |
| JP | H8-241937 | 9/1996 |
| JP | H9-205175 | 8/1997 |

* cited by examiner

Primary Examiner—Tom Thomas
Assistant Examiner—Nitin Parekh
(74) Attorney, Agent, or Firm—Rabin & Berdo, P.C.

(57) ABSTRACT

A semiconductor. device comprises a semiconductor chip on which a plurality of grooves are defined, thus acting as a resisting member, the effect of which is to prevent the semiconductor chip from bending. Consequently, the thickness of the lower portion of the plastic layer becomes greater, thereby preventing cracks from occurring on the semiconductor chip.

22 Claims, 7 Drawing Sheets

SEMICONDUCTOR DEVICE

This patent application claims priority based on a Japanese patent application, H10-295817 filed on Oct. 16, 1998, the contents of which are incorporated herein by reference.

BACKGROUND OF THE INVENTION

1. Field of the Invention

The present invention relates to a plastic molding seal semiconductor device, and in particular to an LOC. (Lead on Chip) type semiconductor.

2. Description of the Related Art

Plastic molding seal semiconductor devices for electronic equipment, have been widely used. These semiconductor devices are sealed with plastic to protect the semiconductor chips laid in the semiconductor devices. Recently, these semiconductor devices, especially LSIs (Large Scaled Integrated circuits) have increased in size with the enhancement of integration. For example, the storage capacity of. memory devices is increasing, and therefore the memory devices must become larger as well. This is demonstrated by 16 MB DRAM and 64 MB DRAM, for example.

On the other hand, appliances tend to be increasingly smaller in size, which requires the semiconductor devices to be smaller. To satisfy these two divergent requirement of integration, LOC (Lead On Chip) type semiconductor devices are employed, in which one end of each of a plurality of leads is arranged overlapping with the semiconductor chip.

FIG. 1A shows the inside of the semiconductor device, FIG. 1B is a cross sectional view of the semiconductor device taken along the line A—A of FIG. 1A, and FIG. 1C shows a cross sectional view of the semiconductor device taken along the line B—B of FIG. 1A. As shown in FIG. 1A, since this semiconductor device is of the LOC type, a plurality of leads 92 are arranged directly on the semiconductor chip 91 via a plurality of insulating tapes 93. Also mounted on the semiconductor chip 91 are a plurality of pads 95. Each pad 95 serves as an electrode used for connecting one of a plurality of terminals of the semiconductor chip 91 to an external circuit (not shown), wherein each pad 95 for a terminal is connected to a corresponding lead 92 using a bonding wire 96. The semiconductor chip 91 and most of each lead 92 are molded with a plastic sealing layer 97, that is to say, a package. The other end of each lead 92, that is to say, the end that is not molded with the plastic sealing layer 97, protrudes from the plastic sealing layer 97, and is connectable to the above-mentioned external circuit.

In the LOC semiconductor devices, the leads 92 are arranged on the semiconductor chip 91 without using a die-pad for supporting the semiconductor chip 91. Accordingly, the LOC semiconductor devices are reduced in size compared with other semiconductor devices. In other words, the LOC semiconductor device can accommodate a semiconductor chip whose size is almost 90% of the LOC semiconductor device.

In the LOC semiconductor devices, in particular the TSOP (Thin Small Outline Package) semiconductor device, the thickness, that is, the distance between the top of the upper portion 97A of the plastic sealing layer 97 and the bottom of the protruding end of the lead 92, is required to be less than 1.27 mm. Therefore, it is necessary to reduce the thickness of the plastic sealing layer 97. On the other hand, in these devices it is also required that the upper portion 97A be thick enough to cover the bonding wire 96. Consequently, both the length D1 of the upper portion 97A and the length D2 of the lower portion 97B of the plastic sealing layer 97 are designed to be thin, and in addition the length D1 is designed to be larger than the length D2, as shown in FIG. 1B.

The semiconductor chip 91 has a small linear expansivity or shrinkage ratio. On the contrary, the plastic sealing layer 97 has a large linear expansivity or shrinkage ratio. The upper portion 97A is larger in thickness than the lower portion 97B, so that the upper portion 97A shrinks more than the lower portion 97B. As a result, the plastic sealing layer 97 becomes warped while the semiconductor chip 91 remains flat. This yields a stress around the center of the semiconductor chip 91, thus causing a crack or fracture 98 in the lateral direction of the semiconductor chip 91 in the bottom side of the semiconductor chip 91 as shown in FIG. 1C.

On the other hand, the semiconductor chip 91 and the lower portion 97B could become exfoliated during the operation of the semiconductor equipment due to the difference in linear expansivity between the semiconductor chip 91 and the plastic sealing layer 97. A partial exfoliation does not cause damage to the semiconductor chip 91. However, a total exfoliation might yield a crack in the semiconductor chip 91 or in the plastic sealing layer 97. If water is absorbed in the semiconductor device, the water will vaporize to yield a crack therein.

As discussed above, the conventional LOC semiconductor device has such drawbacks that cracks may occur in the semiconductor chip or in the plastic sealing layer.

SUMMARY OF THE INVENTION

Therefore, it is an object of the present invention to provide a semiconductor device which overcomes the drawbacks in the related art. This object is achieved by the combinations described in the independent claims. The dependent claims define further advantageous and exemplary combinations of the present invention.

According to an aspect of the present invention, there is provided a semiconductor device comprising: a semiconductor chip including a top side and a bottom side; a package including an upper portion provided on the top side of the semiconductor chip and a lower portion provided on the bottom side thereof, the upper portion being thicker than the lower portion; and a resisting member provided on the bottom side of the semiconductor chip, for preventing the semiconductor chip from being bent.

According to another aspect of the present invention, there is provided a semiconductor device, wherein a plurality of grooves are formed on the bottom side of the semiconductor chip, and the resisting member is defined by the material of the package which lies in the plurality of grooves. The plurality of grooves are preferably arranged in parallel with each other in the longitudinal direction of the semiconductor chip.

According to still, another aspect of the present invention, there is provided a semiconductor device, wherein the bottom side of the semiconductor chip is convex.

According to still another aspect of the present invention, there is provided a semiconductor device, wherein the resisting member has an adhesive which makes the bottom side of the semiconductor chip adhere to the lower portion of the package. This adhesive preferably includes polyimide resin. The adhesive is preferably provided either on all of the bottom side of the semiconductor chip or on a part of the bottom side of the semiconductor chip. If the adhesive is provided on a part of the bottom of the semiconductor chip, then the adhesive is preferably provided either symmetrically in the longitudinal direction of the semiconductor chip, symmetrically in the lateral direction of the semiconductor chip, or on a plurality of separate areas of the bottom side of the semiconductor chip. The plurality of separate areas are preferably either in parallel with each other in the longitudinal direction of the semiconductor chip, or in parallel with each other in the lateral direction of the semiconductor chip. The adhesive preferably includes a polyimide tape, or a polyimide pad, which is made to adhere to the bottom side of the semiconductor chip with a metallic paste. The adhesive preferably lies along the center of the longitudinal axis of the semiconductor chip.

According to still another aspect of the present invention, there is provided a semiconductor device having a plurality of leads formed on a semiconductor chip comprising: a semiconductor chip including a top, side and a bottom side; a package including an upper portion provided on the top side of the semiconductor chip and a lower portion provided on the bottom side thereof, the upper portion being thicker than the lower portion; and a resisting member provided on the bottom side of the semiconductor chip, for preventing the semiconductor chip from being bent.

According to still another aspect of the present invention, there is provided a semiconductor device, the thickness of which is below a given value regulated by a specification of Thin Small Outline Package, comprising: a semiconductor chip including atop side and a bottom side; a package including an upper portion provided on the top side of the semiconductor chip and a lower portion provided on the bottom side thereof, the upper portion being thicker than the lower portion; and a resisting member provided on the bottom side of the semiconductor chip, for preventing the semiconductor chip from being bent.

According to still another aspect of the present invention, there is provided a method of manufacturing a semiconductor device including a semiconductor chip and a package sealing the semiconductor chip, the semiconductor chip having a top side and a bottom side, and a plurality of leads being arranged on the top side of the semiconductor chip, the method comprising: forming a resisting member on the bottom side of the semiconductor chip, for preventing the semiconductor chip from being bent.

According to still another aspect of the present invention, there is provided a semiconductor device, having a thickness below a given value regulated by a specification of Thin Small Outline Packages, comprising: a semiconductor chip including a top side and a bottom side; a package including an upper portion provided on said top side of the semiconductor chip and a lower portion provided on said bottom side thereof, said upper portion being thicker than said lower portion; and a resisting member provided on said bottom side of said semiconductor chip, for preventing said semiconductor chip from being bent.

This summary of the invention does not necessarily describe all necessary features so that the invention may also be a sub-combination of these described features.

BRIEF DESCRIPTION OF THE DRAWINGS

The present invention will be understood more fully from the detailed description given hereinbelow, in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

<First Embodiment>

The first embodiment of the semiconductor device according to the present invention will now be described. In the first embodiment, the bottom side of the semiconductor chip has a groove to increase the thickness of the lower portion of the plastic sealing layer.

Figure 1A:
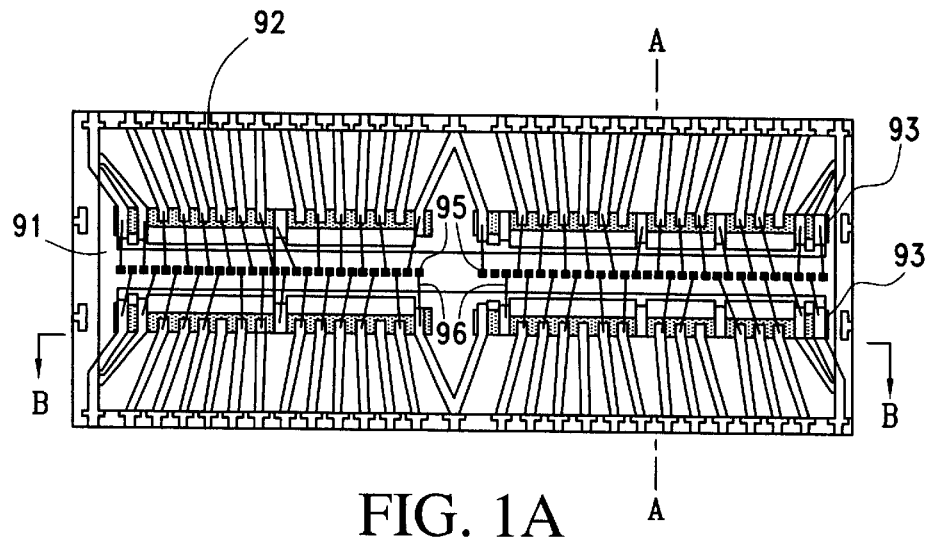
FIG. 1A shows the inside of the conventional LOC semiconductor device.
Figure 1B:
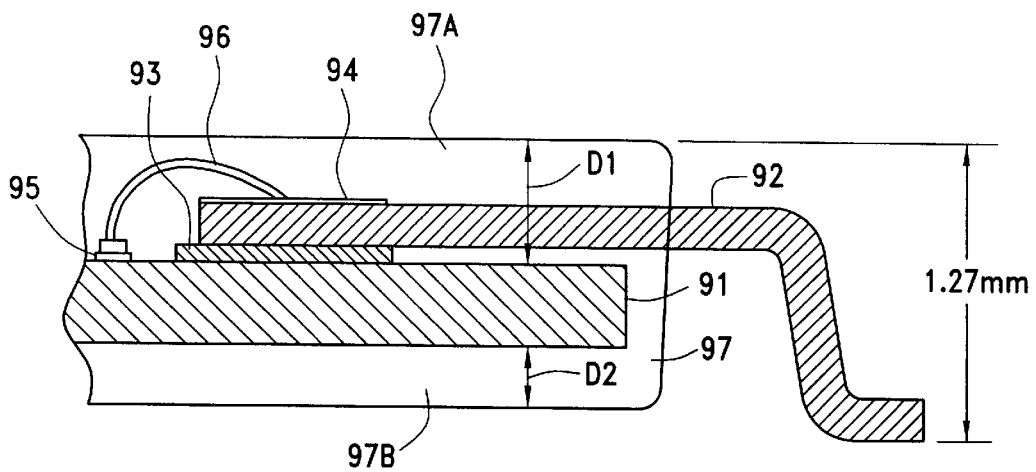
FIG. 1B is a cross sectional view taken along the line A—A of the LOC semiconductor device of FIG. 1A.
Figure 1C:
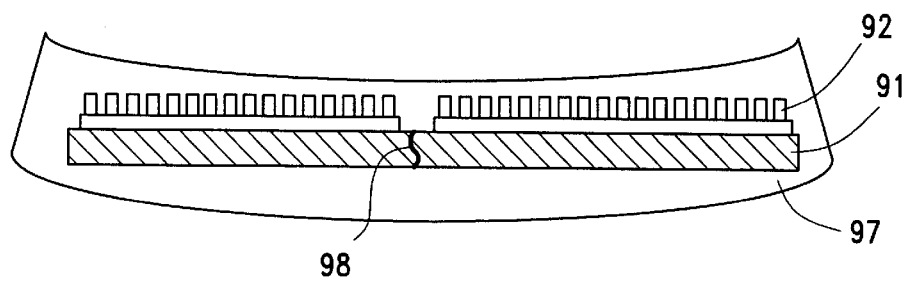
FIG. 1C is another cross sectional view taken along the line B—B of the LOC semiconductor device of FIG. 1A.
Figure 2A:
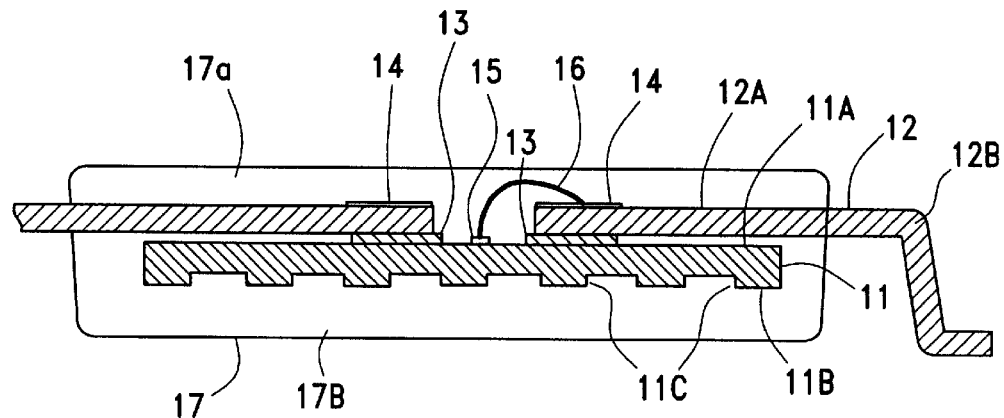
FIG. 2A is a cross sectional view of the semiconductor device of the first embodiment according to the present invention.
Figure 2B:
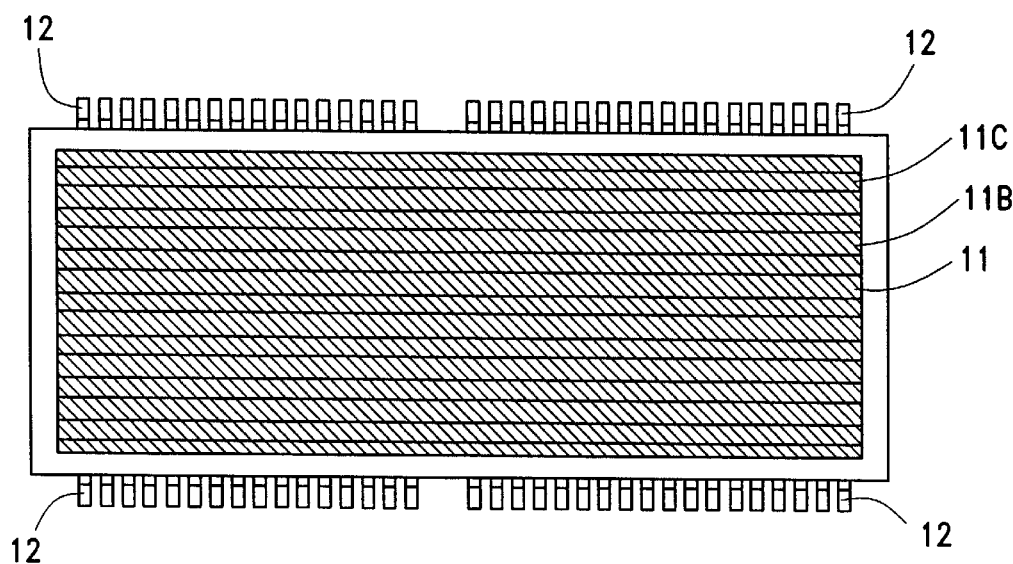
FIG. 2B shows the bottom of the semiconductor chip of the semiconductor device of FIG. 2A.

FIG. 2A is a cross sectional view of the semiconductor device of the first embodiment, and FIG. 2B shows the bottom of the semiconductor chip mounted in the semiconductor device.

The semiconductor device is an LOC (Lead On Chip) semiconductor device, and in particular, a TSOP (Thin Small Outline Package) semiconductor device. Therefore, the thickness of the semiconductor device is below 1.27 mm as explained above.

The semiconductor device incorporates a semiconductor chip 11, a plurality of leads 12, a plurality of insulation tapes 13, a plurality of electrode pads 15, a plurality of bonding wires 16, and a plastic sealing layer 17. Examples of the materials used for these components are as follows. The insulation tapes 13 are made of a thermoplastic resin, wherein both the top side and the bottom side of the insulation tapes 13 are adhesive. The electrode pads 15 are made of Ni—Fe and Cu. The bonding wires 16 are made of alloy.

On the top side 11A of the semiconductor chip 11, one end of each lead 12 is arranged via an insulation tape 13. Specifically, each lead 12 is arranged such that one end of each lead 12 is directed toward a pad 15. Around the center of the side 11A of the semiconductor chip 11, the plurality of pads 15 are formed in the longitudinal direction of the semiconductor chip 11. Each pad 15 serves as an electrode for connecting a functional element or terminal formed on the. semiconductor chip 11 to an external circuit (not shown). The plastic sealing layer 17 molds the semiconductor chip 11 and other components. That is, the plastic sealing layer 17 serves as a package for sealing the semiconductor chip 11.

One end of each bonding wire 16 is fixed to ahead 12 by a metal plating 14 while the other end of each bonding wire 16 is fixed to the pad 15 facing to the lead 12 through heating with an ultrasonic wave, whereby the lead 12. and the corresponding pad 15 are electrically connected to each other. The internal portion 12A of each lead 12 is covered by the plastic sealing layer 17 as well as the semiconductor chip 11 while the external portion 12B of the lead 12 projects from the semiconductor device. The internal portion 12A and the external portion 12B serve to transmit and receive signals between the semiconductor chip 11 and the external circuit.

As discussed above, since, in the LOC semiconductor device or the TSOP semiconductor device, the internal portions 12A of the leads 12 are fixed on the semiconductor chip 11 without the die pad used in other semiconductor devices, this semiconductor device can accommodate a larger semiconductor chip 11 as compared to previously known semiconductor devices. In other words, this structure of this semiconductor device increases the ratio of the size of the semiconductor chip to the size of the semiconductor. In summary, the plastic sealing layer 17 in semiconductors of this type becomes smaller compared with other types of semiconductors.

In a TSOP semiconductor having such a structure, a plurality of grooves 11C are formed in the bottom side 11B of the semiconductor chip 11. More specifically, the plurality of grooves 11C, which act as a resisting member for preventing the semiconductor chip 11 from being warped or bent, are arranged in parallel with each other in the longitudinal direction of the semiconductor chip 11. As explained above, the upper portion 17A of the plastic sealing layer 17 is required to be thicker than the lower portion 17B of the plastic sealing layer 17 so that the upper portion 17A completely covers the bonding wires 16. In accordance with the present invention, however, since the plurality of grooves 11C are formed in the semiconductor chip 11, the thickness of the lower portion 17B of the plastic sealing layer 17 is increased at the location of the grooves. Hence, the thickness of the lower portion 17B of the plastic sealing layer 17 becomes closer to that of upper portion 17A thereof. Accordingly, the magnitude of the stress in the upper portion 17A becomes almost the same as the magnitude of the stress in the lower portion 17B, whereby the warpage of the plastic sealing layer 17 is reduced compared to the conventional art. This decreases the probability of cracks occurring in the semiconductor chip 11.

The distance between the surface of the plastic sealing layer 17 and the far end of the external portion 12B of the lead 12 is 1.27 mm by the specification of the TSOP semiconductor device; in addition, the thickness of plastic sealing layer 17 is below approximately 1.00 mm while the thickness of the lower portion 17B ranges from approximately 0.3 mm to approximately 0.4 mm. Therefore, it is preferable that the depth of each groove 11C ranges from approximately 10 um to approximately 100 um, that is to say, from approximately 1/40 of the thickness of the lower portion 17B to approximately 1/3 thereof. If the depth of the groove 11C is more than 100 um, the strength of the semiconductor chip 11 itself is reduced such that cracks may easily occur therein.

<Second Embodiment>

The second embodiment of the semiconductor device according to the present invention will now be described.

Figure 3A:
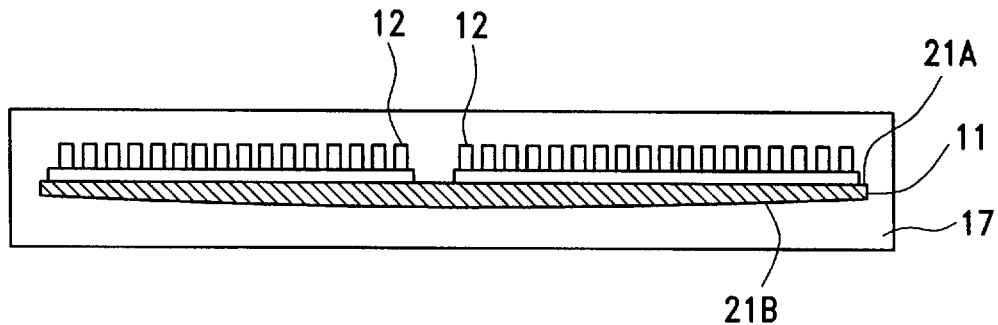
FIG. 3A is a cross sectional view of the semiconductor device of the second embodiment according to the present invention.
Figure 3B:
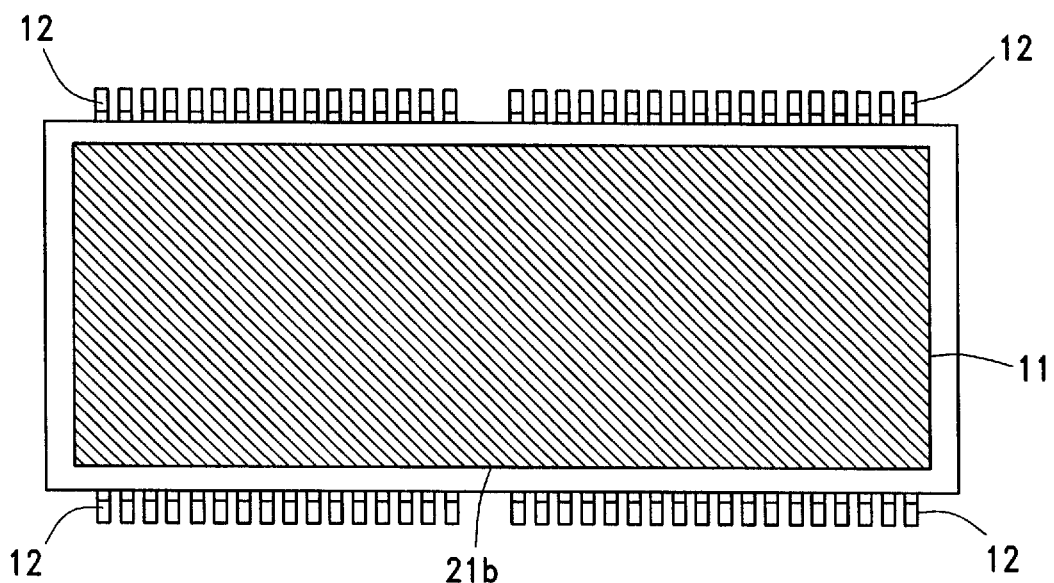
FIG. 3B shows the bottom side of the semiconductor chip, mounted in the semiconductor device of the second embodiment.

FIG. 3A is a cross sectional view of the semiconductor device of the second embodiment, and FIG. 3B shows the bottom of the semiconductor chip mounted in the semiconductor device of the second embodiment. In the second embodiment, the thickness of the center portion of the semiconductor chip is greater than that of the other portions. In other words, the semiconductor chip has a curved bottom.

The components of the semiconductor device according to the second embodiment are substantially the same as those of the semiconductor device according to the first embodiment; therefore, for ease of explanation, a discussion on the feature of the second embodiment will be made below. In FIG. 3A, the semiconductor chip 11 has a curved or convex shape. The convex portion of the semiconductor chip 11 acts as a resisting member for preventing the semiconductor chip 11 from being warped or bent. More specifically, the thickness of the portion near the center of the semiconductor chip 11 is greater than that of the portion near the edges. Accordingly, the strength of the center portion of the semiconductor chip 11 for resisting the stress of the plastic. sealing layer 17 becomes greater than the strength of the other portions of the semiconductor chip 11.

As clearly shown in FIG. 3A between the two opposite longer sides of the chip, the thickness of the central portion of the chip 11 is even, as is the thickness of each of the end portions of the chip located adjacent to the opposite shorter sides of the chip.

In summary, as explained above, in the second embodiment, the center portion of the semiconductor chip 11 is thicker than the other portions thereof; therefore, the strength of the center of the semiconductor chip 11 for resisting the stress of the plastic sealing layer 17 becomes greater, so as to prevent cracks from occurring on the bottom 11B of the semiconductor chip 11.

<Third Embodiment>

The third embodiment of the semiconductor device according to the present invention will now be described in detail.

Figure 4A:
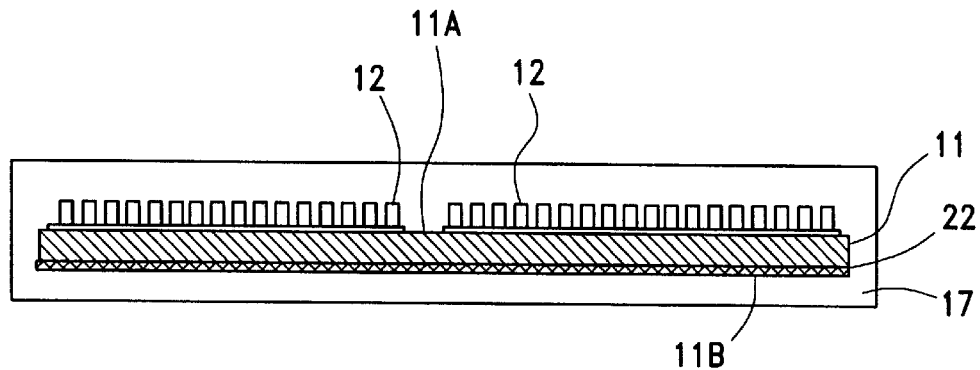
FIG. 4A is a cross sectional view of the semiconductor device of the third embodiment according to the present invention.
Figure 4B:
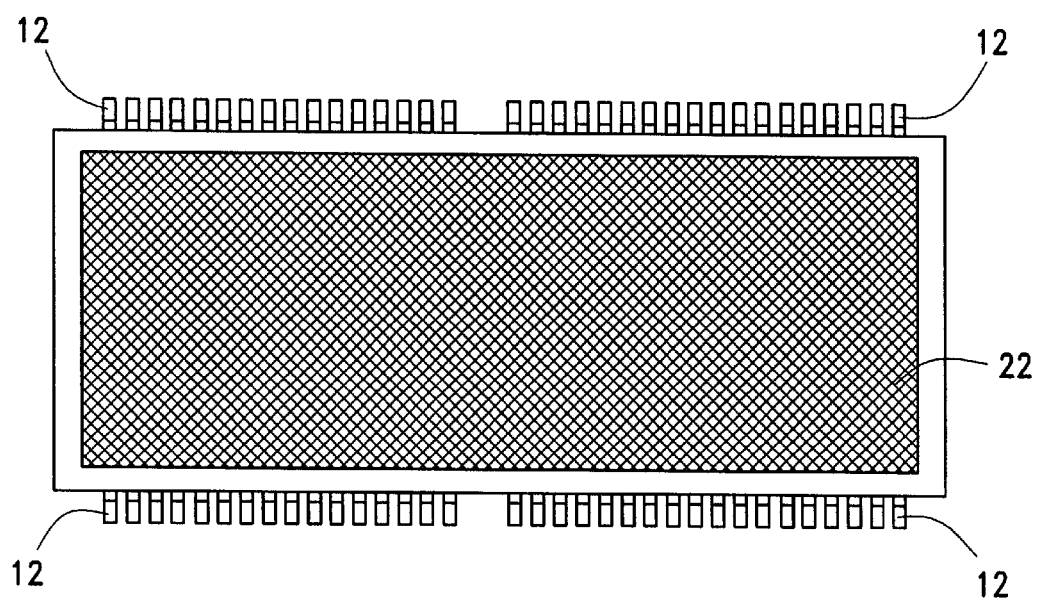
FIG. 4B shows the bottom side of the semiconductor chip mounted in the semiconductor device of the third embodiment.

FIG. 4A is a cross sectional view of the semiconductor device of the third embodiment, and FIG. 4B shows the bottom of the semiconductor chip mounted in the semiconductor device. The components, of the semiconductor device of the third embodiment are substantially the same as those of the semiconductor device of the first embodiment. Therefore, the distinguishing features of the third embodiment will be discussed below.

In the third embodiment, an adhesive 22 is applied between the semiconductor chip 11 and the plastic sealing layer 17, such that the adhesive 22 serves to prevent the semiconductor chip 11 from being warped or bent. The adhesive 22 is made of polyimide resin. In FIGS. 4A and 4B, the entire bottom side of the semiconductor chip 11 is coated with the polyimide resin 22 to avoid exfoliation of the semiconductor chip 11 from the plastic sealing layer 17. In this way, even if there occurs a warpage in the plastic sealing layer 17, the adhesion between the semiconductor chip 11 and the plastic sealing layer 17 obtained by the polyimide resin 22 prevents exfoliation of the semiconductor 11 from the plastic sealing layer 17. Consequently, this prevents cracks from occurring in the bottom side of the semiconductor chip 11.

Figure 5A:
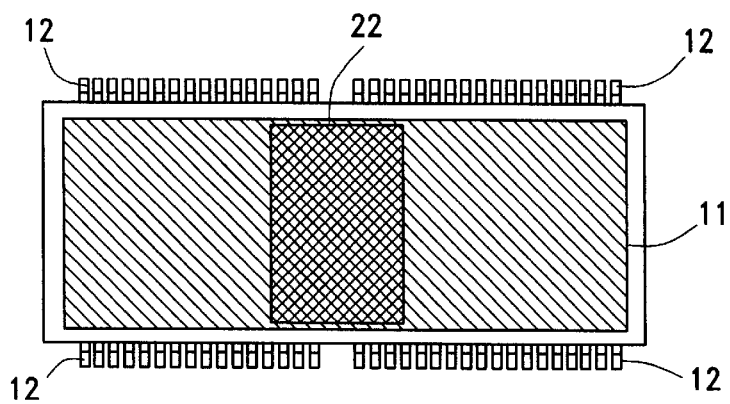
FIGS. 5A–5D show coating patterns of the adhesive of the third embodiment.
Figure 5B:
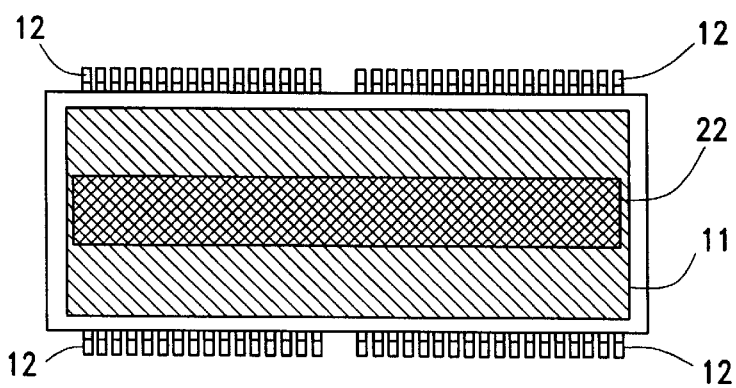

FIGS. 5A–5D show examples of the coating patterns of the polyimide resin 22. In FIG. 5A, the polyimide resin 22 is coated in the lateral direction of the semiconductor chip 11. Specifically, the polyimide resin 22 is applied in the lateral direction symmetrically with respect to the lateral axis of the semiconductor chip 11. In FIG. 5B, the polyimide resin 22 is applied in the longitudinal direction symmetrically with respect to the longitudinal axis of the semiconductor chip 11.

Figure 5C:
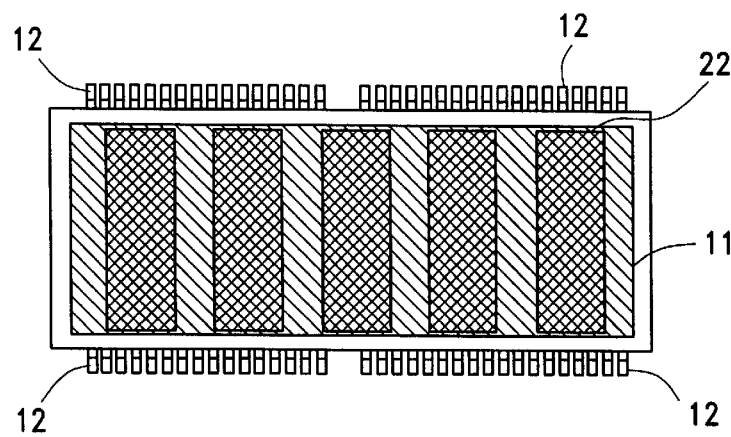
Figure 5D:
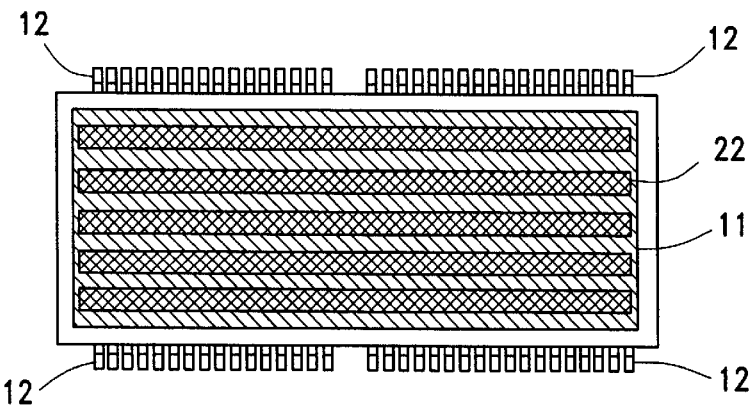

In FIGS. 5C and 5D, the polyimide resin 22 includes a plurality of polyimide resin portions. In FIG. 5C, the plurality of polyimide resin portions are in parallel with each other in the lateral direction of the semiconductor chip 11. Similarly, in FIG. 5D, the plurality of polyimide resin portions are in parallel with each other in the longitudinal direction of the semiconductor chip 11. All the coating patterns of the polyimide resin 22 ensure the adhesion of the semiconductor chip 11 and the plastic sealing layer 17, thus preventing exfoliation of the semiconductor chip 11 that cause cracks in the semiconductor chip 11 or in the plastic sealing layer 17.

<Fourth Embodiment>

The fourth embodiment of the semiconductor device according to the present invention will now be described in detail.

Figure 6A:
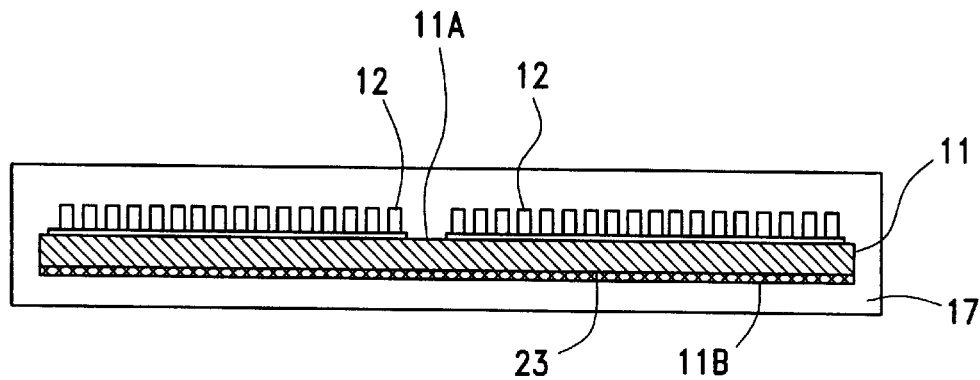
FIG. 6A is a cross sectional view of the semiconductor device of the fourth embodiment according to the present invention.
Figure 6B:
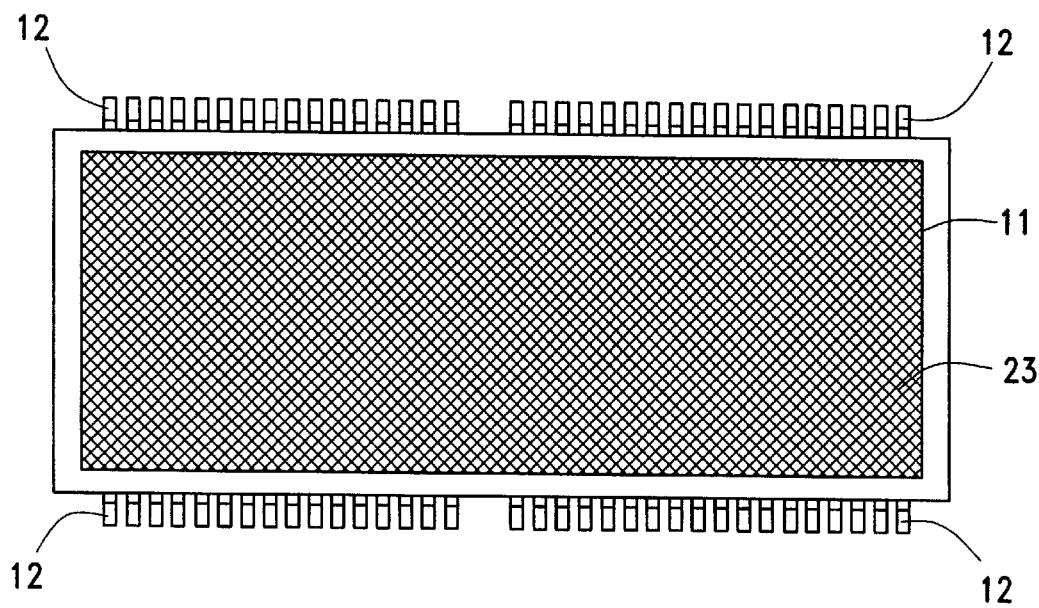
FIG. 6B shows the bottom side of the semiconductor chip mounted in the semiconductor device of the fourth embodiment.

FIG. 6A is a cross sectional view of the semiconductor device of the fourth embodiment, and FIG. 6B shows the bottom side of the semiconductor chip mounted in the semiconductor device. The components of the semiconductor device according to the fourth embodiment are substantially the same as those of the semiconductor device according to the third embodiment; therefore, the following explanation will focus on the distinguishing features of the fourth embodiment. In the fourth embodiment, a polyimide tape is pasted or stuck onto the semiconductor chip. That is, the polyimide tape 23 is stuck on the entire bottom side of the semiconductor chip 11 to make the semiconductor chip 11 adhere to the plastic sealing layer 17. This prevents exfoliation of the semiconductor chip 11 from the plastic sealing layer 17, thus preventing cracks from occurring in the plastic sealing layer 17. The polyimide tape 23 is preferably stuck on the entire bottom side 11B of the semiconductor chip 11, as shown in FIG. 6B. However, the polyimide tape 23 may be stuck to a part of the bottom side 11B, as shown in FIGS. 5A and 5B analogously for the case of the above polyimide resin. That is, the polyimide tape 23 may be pasted in the lateral direction symmetrically with respect to the lateral axis of the semiconductor chip 11, and may be pasted in the longitudinal direction symmetrically with respect to the longitudinal axis thereof.

Further, the polyimide tape 23 may include a plurality of polyimide tape portions. These polyimide tape portions may be pasted in parallel with each other in the lateral direction of the semiconductor chip 11 as shown in FIG. 5C or in the longitudinal direction of the semiconductor chip 11 as shown in FIG. 5D. All these patterns of the polyimide tape 23 enable the semiconductor chip 11 and the plastic sealing layer 17 to adhere securely to each other, which prevents the exfoliation of the semiconductor chip 11 from the plastic sealing layer 17 so as to prevent the occurrence of cracks in the semiconductor chip 1 or in the plastic sealing layer 17.

<Fifth Embodiment>

The fifth embodiment of the semiconductor device according to the present invention will now be described in detail.

Figure 7A:
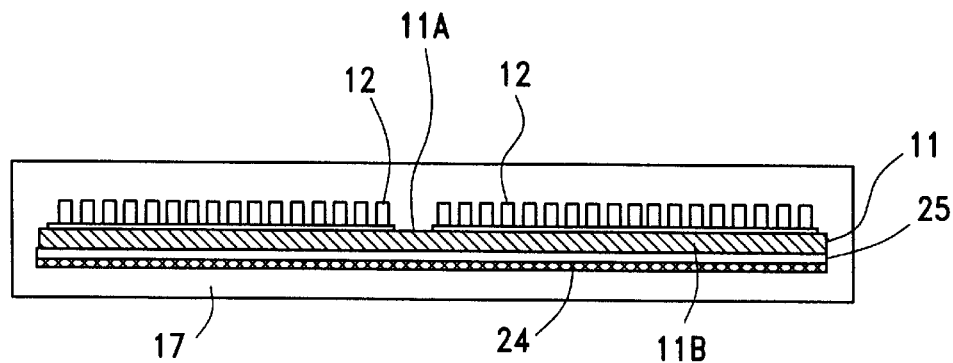
FIG. 7A is a cross sectional view of the semiconductor device of the fifth embodiment according to the present invention.
Figure 7B:
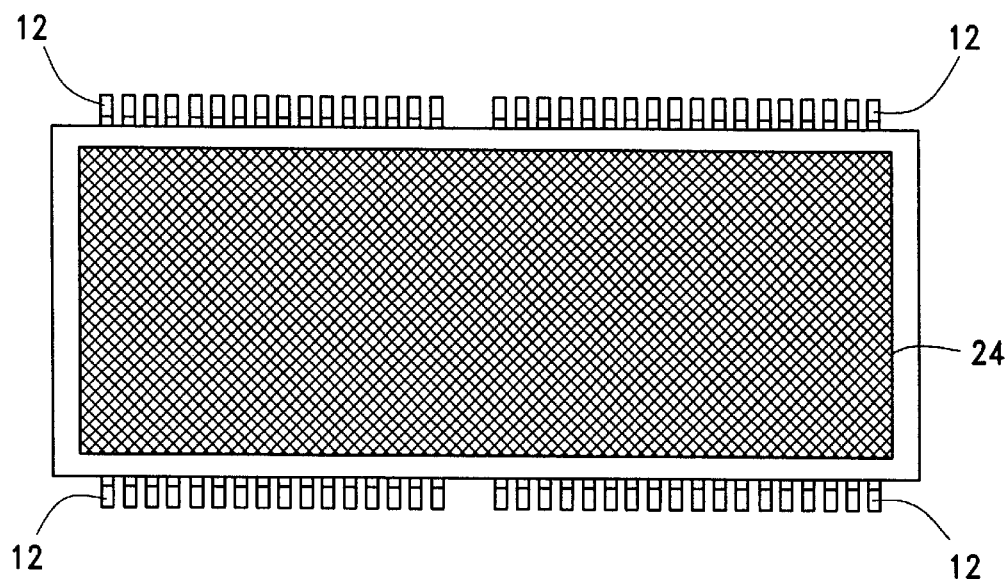
FIG. 7B shows the bottom side of the semiconductor chip mounted in the semiconductor device of the fifth embodiment.

FIG. 7A is a cross sectional view of the fifth embodiment of the semiconductor device, and FIG. 7B shows the bottom of the semiconductor chip mounted in the semiconductor device of FIG. 7B. Like the fourth embodiment, the components of the fifth embodiment are substantially the same as those of the third embodiment; therefore, the following discussion will focus on the distinguishing features of the fifth embodiment. In the fifth embodiment, a polyimide pad is fixed or attached to the semiconductor chip. That is, as shown in FIGS. 7A and 7B, the polyimide pad 24 is fixed on the bottom side of the semiconductor chip 11 using a metallic adhesive or a metallic paste 25 to achieve adhesion between the semiconductor chip 41 and the plastic sealing layer 17. The polyimide pad 24 is, for example, made of glass epoxy resin. The adhesion of the semiconductor chip 11 to the plastic sealing layer 17 prevents exfoliation of the semiconductor chip 11 from the plastic sealing layer 17, thereby preventing the occurrence of cracks in the. semiconductor chip 11 or in the plastic sealing layer 17.

In FIG. 7B, the polyimide pad 24 is fixed on the entire bottom of the semiconductor chip 11; however, the polyimide pad 24 may be fixed on a part of the bottom of the semiconductor chip 11 analogously to the structures of FIGS. 5A–5D. That is, the polyimide pad 24 may be fixed in the lateral direction symmetrically with respect to the lateral axis of the semiconductor chip 11 as shown in FIG. 5A while it may be fixed in the longitudinal direction symmetrically with respect to the longitudinal axis of the semiconductor chip 11 as show in FIG. 5B. in addition, the polyimide pad 24 may include a plurality of polyimide pad portions. The plurality of polyimide pad portions may be arranged in parallels with each other in the lateral direction of the semiconductor chip 11 as shown in FIG. 5C, and they may be arranged in parallel with each other in the longitudinal direction of the semiconductor chip 11 as shown in FIG. 5D. These structures can provide the same effect as when the polyimide pad 24 covers the entirety of the bottom of the semiconductor chip 11.

The first through fifth embodiments explained above discuss the application of the present invention to the LOC semiconductor device; however, the present invention can also be applied to, for example, the SOJ (Small Outline J-Leaded Package) semiconductor device or the SOP (Small Outline Package) semiconductor device.

Although the present invention has been described by way of exemplary embodiments, it should be understood that many changes and substitutions may be made by those skilled in the art without departing from the spirit and the scope of the present invention which is defined only by the appended claims.

What is claimed is:

1. A semiconductor device, comprising:
   a semiconductor chip having
      a top surface and a bottom surface, the bottom surface being opposite to the top surface and having a plurality of grooves formed therein, and
      a first side and a second side, the first side being longer than the second side, all grooves in the bottom surface, including all of the plurality of grooves, extending in a direction parallel to the first side;
   a plurality of electrodes formed on the top surface; and
   a package sealing the semiconductor chip including the grooves, and the electrodes; wherein the package has an upper portion provided on the top surface of the semiconductor chip and a lower portion provided on the bottom surface thereof, and wherein a depth of the grooves is in a range from approximately $1/40$ to approximately $1/3$ of the thickness of the lower portion.

2. A semiconductor device as set forth in claim 1, further comprising a plurality of leads arranged on the top surface so as to be electrically connected to the electrodes, the leads extending across the first side.

3. A semiconductor device as set forth in claim 2, wherein the electrodes are arranged in parallel to the first side.

4. A semiconductor device as set forth in claim 3, wherein the electrodes are arranged along a central line of the semiconductor chip, the central line being parallel to the first side.

5. A semiconductor device as set forth in claim 1, wherein the package has an upper portion provided on the top surface of the semiconductor chip and a lower portion provided on the bottom surface thereof, the upper portion being thicker than the lower portion.

6. A semiconductor device as set forth in claim 2, further comprising bonding wires connecting the electrodes with the leads, the bonding wires being sealed by the package.

7. A semiconductor device as set forth in claim 1, wherein a thickness of said semiconductor device is below a given value regulated by a specification of Thin Small Outline Packages.

8. A semiconductor device as set forth in claim 1, wherein the first and second sides bound the upper surface, further comprising a plurality of leads arranged on the top surface so as to be electrically connected to the electrodes, the leads extending across the first side.

9. A semiconductor device as set forth in claim 8, wherein the electrodes are aligned in parallel to the first side.

10. A semiconductor device as set forth in claim 9, wherein the electrodes are arranged along a central line of the semiconductor chip, the central line being parallel to the first side.

11. A semiconductor device as set forth in claim 1, wherein the package has opposite upper and lower surfaces respectively of the upper and lower portions thereof, the upper surface of the package opposite the top surface of the chip and the lower surface of the package opposite the bottom surface of the chip, a thickness of the upper portion of the package being less than approximately 1.00 mm, a thickness of the lower portion of the package being in the range of approximately 0.3 mm to 0.4 mm, and the depth of the grooves being in the range from approximately 10 micrometers to approximately 100 micrometers.

12. A semiconductor device as set forth in claim 11, further comprising a lead having a lead inner portion penetrating a package side surface of the package and extending along the top surface of the chip, the lead interior portion having a first lead end electrically connected to the chip, the lead further having a lead exterior portion integrally joined with the lead interior portion at the package side surface and extending in a direction toward a plane containing the package lower surface, the lead second portion having a second lead a distance 1.27 mm from a plane containing the package upper surface.

13. A semiconductor device, comprising:
a semiconductor chip having two opposite first sides, two opposite second sides, a top surface and a bottom surface, the first sides being longer than the second sides, and the top surface being opposite to the bottom surface, wherein the chip includes opposite chip end portions adjacent to the second sides, and a chip central portion therebetween extending between the two opposite first sides, the chip having a thickness measured between the top and bottom surfaces, the thickness being greater in the chip central portion than in the chip end portions;
a plurality of electrodes formed on the top surface; and
a package sealing the semiconductor chip and the electrodes, wherein the chip bottom surface is noncave as measured in a direction that extends from one of the opposite second sides toward the other, over the entire chip central portion, and over the entireties of both of the chip end portions.

14. A semiconductor device as set forth in claim 13, wherein the chip bottom surface is convex as measured from one of the opposite second sides to the other.

15. A semiconductor device as set forth in claim 13, wherein the chip bottom surface is entirely nonplanar.

16. A semiconductor device as set forth in claim 13, wherein the chip bottom surface has a center line midway between the opposite second sides, extending between the opposite first sides, the chip bottom surface extending in a direction toward a plane containing the top surface as measured in opposite directions continuously from the center line toward the opposite second sides.

17. A semiconductor device as set forth in claim 13, wherein the chip bottom surface is convex over the entire chip central portion as measured in a direction from one of the opposites second sides toward the other.

18. A semicoductor device, comprising:
a semiconductor chip having two opposite first sides two opposite second sides, a top surface and a bottom surface, the first sides being longer than the second sides, and the top surface being opposite to the bottom surface, wherein the chip includes opposite chip end portions adjacent to the second sides, and a chip central portion therebetween extending between the two opposite first sides, the chip having a thickness measured between the top and bottom surfaces, the thickness being greater in the chip central portion than in the chip end portions;
a plurality of electrodes formed on the top surface; and
a package sealing the semiconductor chip and the electrodes, wherein the thickness of the chip over the entire chip central portion is approximately even, and wherein the thickness of the chip over the entirety of each of the chip end portions is approximately even, wherein the chip bottom surface is convex as measured along lines extending from one of the opposite second sides toward the other, over the chip central portion.

19. A semiconductor device, comprising:
a semiconductor chip having two opposite first sides, two opposite second sides, a top surface and a bottom surface, the first sides being longer than the second sides, and the top surface being opposite to the bottom surface, wherein the chip includes opposite chip end portions adjacent to the second sides, and a chip central portion therebetween extending between the two opposite first sides, the chip having a thickness measured between the top and bottom surfaces, the thickness being greater in the chip central portion than in the chip end portions;
a plurality of electrodes formed on the top surface; and
a package sealing the semiconductor chip and the electrodes, wherein the thickness of the chip over the entire chip central portion is approximately even, and wherein the thickness of the chip over the entirety of each of the chip end portions is approximately even, wherein the chip bottom surface is convex, as measured along lines extending from one of the opposite second sides to the other.

20. A semiconductor device, comprising:

a semiconductor chip having two opposite first sides, two opposite second sides, a top surface and a bottom surface, the first sides being longer than the second sides, and the top surface being opposite to the bottom surface, wherein the chip includes opposite chip end portions adjacent to the second sides, and a chip central portion therebetween extending between the two opposite first sides, the chip having a thickness measured between the top and bottom surfaces, the thickness being greater in the chip central portion than in the chip end portions;

a plurality of electrodes formed on the top surface; and a package sealing the semiconductor chip and the electrodes, wherein the thickness of the chip over the entire chip central portion is approximately even, and wherein the thickness of the chip over the entirety of each of the chip end portions is approximately even, wherein the chip bottom surface is entirely non-planar.

21. A semiconductor device, comprising:

a semiconductor chip having two opposite first sides, two opposite second sides, a top surface and a bottom surface, the first sides being longer than the second sides, and the top surface being opposite to the bottom surface, wherein the chip includes opposite chip end portions adjacent to the second sides, and a chip central portion therebetween extending between the two opposite first sides, the chip having a thickness measured between the top and bottom surfaces, the thickness being greater in the chip central portion than in the chip end portions;

a plurality of electrodes formed on the top surface; and a package sealing the semiconductor chip and the electrodes, wherein the thickness of the chip over the entire chip central portion is approximately even, and wherein the thickness of the chip over the entirety of each of the chip end portions is approximately even, wherein the chip bottom surface has a center line midway between the opposite second sides, extending between the opposite first sides, the chip bottom surface extending in a direction toward a plane containing the top surface as measured in opposite directions continuously from the center line toward the opposite second sides.

22. A semiconductor device, comprising:

a semiconductor chip having two opposite first sides, two opposite second sides, a top surface and a bottom surface, the first sides being longer than the second sides, and the top surface being opposite to the bottom surface, wherein the chip includes opposite chip end portions adjacent to the second sides, and a chip central portion therebetween extending between the two opposite first sides, the chip having a thickness measured between the top and bottom surfaces, the thickness being greater in the chip central portion than in the chip end portions;

a plurality of electrodes formed on the top surface; and a package sealing the semiconductor chip and the electrodes, wherein the thickness of the chip over the entire chip central portion is approximately even, and wherein the thickness of the chip over the entirety of each of the chip end portions is approximately even, wherein the thickness of the chip decreases gradually from the chip central portion to each of the two opposite second sides.

* * * * *